(12) United States Patent
Ono

(10) Patent No.: US 10,260,145 B2
(45) Date of Patent: Apr. 16, 2019

(54) FILM FORMATION APPARATUS AND FILM FORMATION METHOD

(71) Applicant: Shibaura Mechatronics Corporation, Yokohama-shi, Kanagawa (JP)

(72) Inventor: Daisuke Ono, Yokohama (JP)

(73) Assignee: Shibaura Mechatronics Corporation, Yokohama-shi (JP)

(*) Notice: Subject to any disclaimer, the term of this patent is extended or adjusted under 35 U.S.C. 154(b) by 32 days.

(21) Appl. No.: 15/461,906

(22) Filed: Mar. 17, 2017

(65) Prior Publication Data

US 2017/0268098 A1    Sep. 21, 2017

(30) Foreign Application Priority Data

Mar. 17, 2016    (JP) ................................ 2016-053446

(51) Int. Cl.
*C23C 14/08*    (2006.01)
*C23C 14/34*    (2006.01)
*C23C 14/54*    (2006.01)
*H01J 37/34*    (2006.01)

(52) U.S. Cl.
CPC ........ *C23C 14/3457* (2013.01); *C23C 14/086* (2013.01); *C23C 14/54* (2013.01); *H01J 37/3426* (2013.01); *H01J 37/3476* (2013.01)

(58) Field of Classification Search
CPC ... C23C 14/3457; C23C 14/086; C23C 14/54; H01J 37/3426; H01J 37/3476
See application file for complete search history.

(56) References Cited

U.S. PATENT DOCUMENTS 4,331,856 A * 5/1982 D'Antonio ................ C23C 8/36
204/164
9,637,814 B2 * 5/2017 Bugyi ................. C23C 14/0042

FOREIGN PATENT DOCUMENTS

JP        S58-94703 A    6/1983

* cited by examiner

*Primary Examiner* — John J Brayton
(74) *Attorney, Agent, or Firm* — Crawford Maunu PLLC

(57) ABSTRACT

A film formation apparatus includes a chamber that is a sealed container in which a target formed of a film formation material is placed, and into which the workpiece is carried, a gas discharging unit discharging a gas in the sealed container for a predetermined time period after the workpiece is carried into the chamber to obtain a base pressure, and a sputter gas introducing unit introducing a sputter gas containing oxygen to the interior of the chamber having undergone the discharging and becoming the base pressure. The sputter gas introducing unit decreases an oxygen partial pressure in the sputter gas to be introduced in the chamber in accordance with an increase in the base pressure due to an increase of the film formation material sticking to the interior of the chamber.

5 Claims, 6 Drawing Sheets

FILM FORMATION APPARATUS AND FILM FORMATION METHOD

CROSS-REFERENCE TO RELATED APPLICATION

This application is based upon and claims the benefit of priority from Japan Patent Application No. 2016-053446, filed on Mar. 17, 2016, the entire contents of which are incorporated herein by reference.

FIELD OF THE INVENTION

The present disclosure relates to a film formation apparatus and a film formation method.

BACKGROUND

A transparent and conductive oxidized film, such as an Indium Tin Oxide (ITO) film, is formed on a workpiece like an insulative substrate which is formed of glass or a plastic resin, and which is utilized for touch panels, etc. A film formation apparatus, that has a target formed of a film formation material placed in a chamber that is a sealed container, is applied for film formation. A sputter gas containing oxygen is introduced into the chamber, a DC voltage is applied to the target to obtain the plasma of the sputter gas and to produce ions, and the ions collide with the target. Material particles beaten out from the target are deposited on the workpiece, and thus a film is formed thereon.

At the time of film formation process, the film formation material sticks not only to the surface of the workpiece but also to the internal wall of the chamber. When the film formation process is repeatedly executed, the amount of sticking material increases. The film formation material sticking to the internal wall of the chamber produces an outgas. This outgas contains oxygen, and this oxygen is also ionized by plasma. Hence, upon repeating the film formation process, the amount of oxygen increases. When, in the film formation process, the appropriate amount of oxygen is not maintained, the resistance value may increase in the ITO film formed. That is, the quality of the products becomes non-uniform, and result in a possibility of a defective product.

It is known that, when the oxygen in the chamber increases, the film formation speed decreases. For example, JP S58-94703 A proposes a technology of providing, in the chamber, a measuring element that measures the film formation speed, and of adjusting the amount of oxygen introduced to the chamber in accordance with the decrease of the film formation speed. However, the decrease of the film formation speed indicates a state which the film formation is performed with the total amount of oxygen present in the chamber already exceeding the appropriate amount. Hence, even if the amount of oxygen to be introduced to the chamber is adjusted at this state, the quality may become non-uniform, and result in a possibility of a defective product.

The present disclosure has been made to address the foregoing technical problems, and an objective is to provide highly reliable film formation apparatus and film formation method capable of producing products which have an excellent quality and little variability in quality even when a film formation process is repeatedly executed.

SUMMARY OF THE INVENTION

In order to achieve the above objective, a film formation apparatus according to the present disclosure for forming a film on a workpiece by plasma, and includes:

a sealed container in which a target formed of a film formation material is placed, and into which the workpiece is carried;

a gas discharging unit discharging a gas in the sealed container for a predetermined time period after the workpiece is carried into the sealed container to obtain a base pressure; and a sputter gas introducing unit introducing a sputter gas containing oxygen to an interior of the sealed container having undergone the discharging and became the base pressure;

in which: the sputter gas introducing unit decreases an oxygen partial pressure in the sputter gas to be introduced in the sealed container in accordance with an increase in the base pressure due to an increase of the film formation material sticking to the interior of the sealed container.

The film formation apparatus may further include:

a pressure gauge measuring the base pressure; and a control unit determining, in accordance with the base pressure measured by the pressure gauge, the oxygen partial pressure in the sputter gas to be introduced by the sputter gas introducing unit.

The film formation apparatus may further include:

a power supply unit applying a voltage to the target; and a control unit determining, in accordance with the base pressure determined based on an accumulated power amount supplied from the power supply unit to the target, the oxygen partial pressure in the sputter gas to be introduced by the sputter gas introducing unit.

The film formation apparatus may further include an alert generating unit generating an alert when the base pressure exceeds $6 \times 10^{-3}$ [Pa].

In order to achieve the above objective, a film formation method according to the present disclosure is for forming a film on a workpiece by plasma, and includes:

carrying the workpiece into an interior of a sealed container in which a target formed of a film formation material is placed;

discharging a gas in the sealed container for a predetermined time period after the workpiece is carried in to obtain a base pressure;

introducing a sputter gas containing oxygen to the interior of the sealed container having undergone the discharging and became the base pressure; and decreasing an oxygen partial pressure in the sputter gas to be introduced in the sealed container in accordance with an increase in the base pressure due to an increase of the film formation material sticking to the interior of the sealed container.

The film formation apparatus and film formation method according to the present disclosure enable a production of a product with an excellent quality and with little variability in quality even when the film formation process is repeatedly executed.

DETAILED DESCRIPTION OF THE EMBODIMENTS

[First Embodiment]
[Structure]

A first embodiment of the present disclosure will be explained below with reference to the figures.

Figure 1:
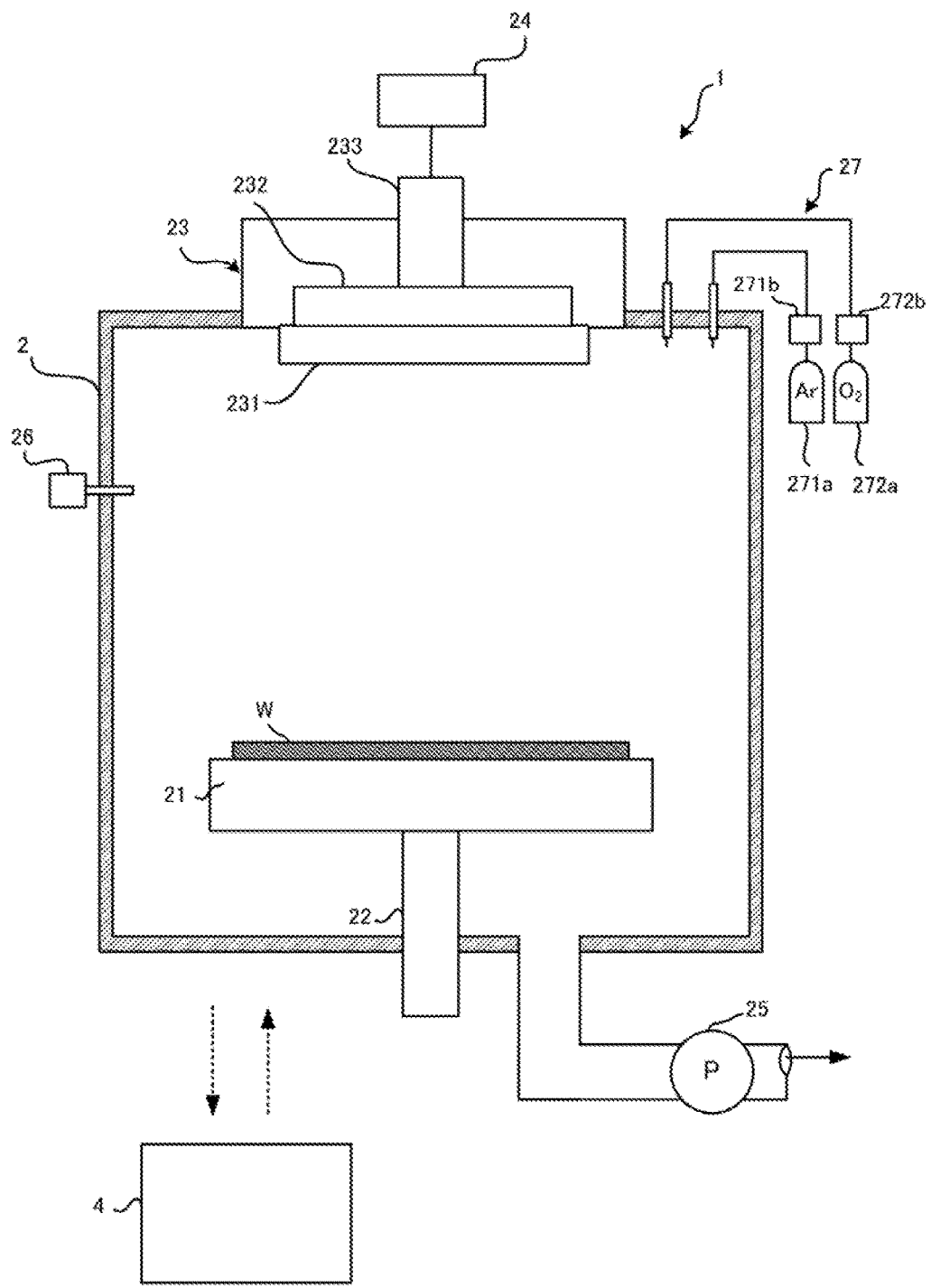
FIG. 1 is an exemplary diagram illustrating a structure of a film formation apparatus according to a first embodiment of the present disclosure.

As illustrated in FIG. 1, a film formation apparatus 1 includes a chamber 2 that is a sealed container, and a stage 21, on which a workpiece W is placed, installed near the bottom of the chamber 2. The type of the workpiece W is not limited to any particular type, but an exemplary workpiece is a polycarbonate substrate.

The stage 21 is in a disk shape, and is coupled to and supported by a shaft 22 extending from the bottom of the chamber 2. The shaft 22 gas-tightly passes completely through the bottom of the chamber 2, and is in connected with the exterior. The chamber 2 is provided with a gas discharging unit 25 and a pressure gauge 26. The gas discharging unit 25 is, for example, a pump, and always discharges the gas inside the chamber 2, thereby maintaining a depressurized condition. The pressure gauge 26 measures the pressure inside the chamber 2.

The chamber 2 is provided with an inlet 20 (see FIG. 2) for the workpiece W. The inlet 20 is connected to an unillustrated load-lock chamber, and the workpiece W is carried into the chamber 2 via the load-lock chamber from the exterior of the film formation apparatus 1. The load-lock chamber is also provided with a gas discharging unit, and when the workpiece W is to be carried in, the load-lock chamber is depressurized to a preset pressure beforehand, and then the inlet 20 is opened. This reduces the pressure increase in the chamber 2. Since the purpose is to reduce the pressure increase in the chamber 2, the preset pressure in the load-lock chamber may be lower than the ambient pressure, but may be higher than the pressure in the chamber 2. The gas discharging unit of the load-lock chamber may have a lower discharging performance than that of the discharging unit 25 of the chamber 2.

Provided on an upper side of the chamber 2 is a sputter source 23. The sputter source 23 is a supply source of a film formation material to be deposited on the workpiece W to form a film thereon. The sputter source 23 includes a target 231, a backing plate 232, and a conductive member 233, and is connected to a power supply unit 24.

The target 231 is attached to, for example, an upper surface of the chamber 2, and is installed so as to have a surface facing the stage 21 installed near the bottom of the chamber 2. The target 231 is formed of a film formation material, and all known film formation materials are applicable as the target 231. When, for example, an ITO film is to be formed, the target 231 contains indium tin oxide. An example shape of the target 231 is a circular cylindrical shape. Other shapes, such as an elongated circular cylindrical shape and a rectangular cylindrical shape, are also applicable.

The backing plate 232 is a member that holds the surface of the target 231 opposite to the stage 21. The conductive member 233 connects the backing plate 232 to the power supply unit 24. Note that the sputter source 23 is also provided with a magnet, a cooling unit, etc., as needed.

The power supply unit 24 applies a voltage to the target 231 via the conductive member 233 and the backing plate 232. That is, the power supply unit 24 applies a voltage to the target 231 to obtain the plasma of the sputter gas introduced around the target 231 and deposit the film formation material on the workpiece W. An example power supply unit 24 in this embodiment is a DC power supply that applies a high voltage. In the case of high-frequency sputtering, an RF power supply is applicable.

In addition, the chamber 2 is provided with a sputter gas introducing unit 27. This sputter gas introducing unit 27 introduces the sputter gas to the inside of the chamber 2. The sputter gas is not limited to any specific type, but in the case of an ITO film formation, for example, a mixture gas of an inactive gas, such as argon, with oxygen is applicable. When the mixture gas is applied, the sputter gas introducing unit 27 controls the introduction partial pressure of the argon gas and oxygen in the sputter gas to be introduced in the chamber 2. More specifically, the sputter gas introducing unit 27 includes an argon gas introducing unit 271a and an oxygen introducing unit 272a. The argon gas introducing unit 271a and the oxygen introducing unit 272a are provided with flow-rate control gauges 271b, 272b, respectively. The flow-rate control gauges 271b, 272b measure the flow rate of the argon gas and the oxygen, respectively, thereby controlling both the argon gas partial pressure and the oxygen gas partial pressure in the sputter gas.

The control unit 4 controls the action of each component of the film formation apparatus 1. This control unit 4 includes, for example, a special-purpose electronic circuit or a computer operated in accordance with a predetermined program. The control unit 4 is programmed with control details for each component, and is executed by a processing unit, such as a PLC or a CPU. Hence, the control unit 4 is capable of being in compatible with a large number of and various types of film formation specifications.

Figure 2:
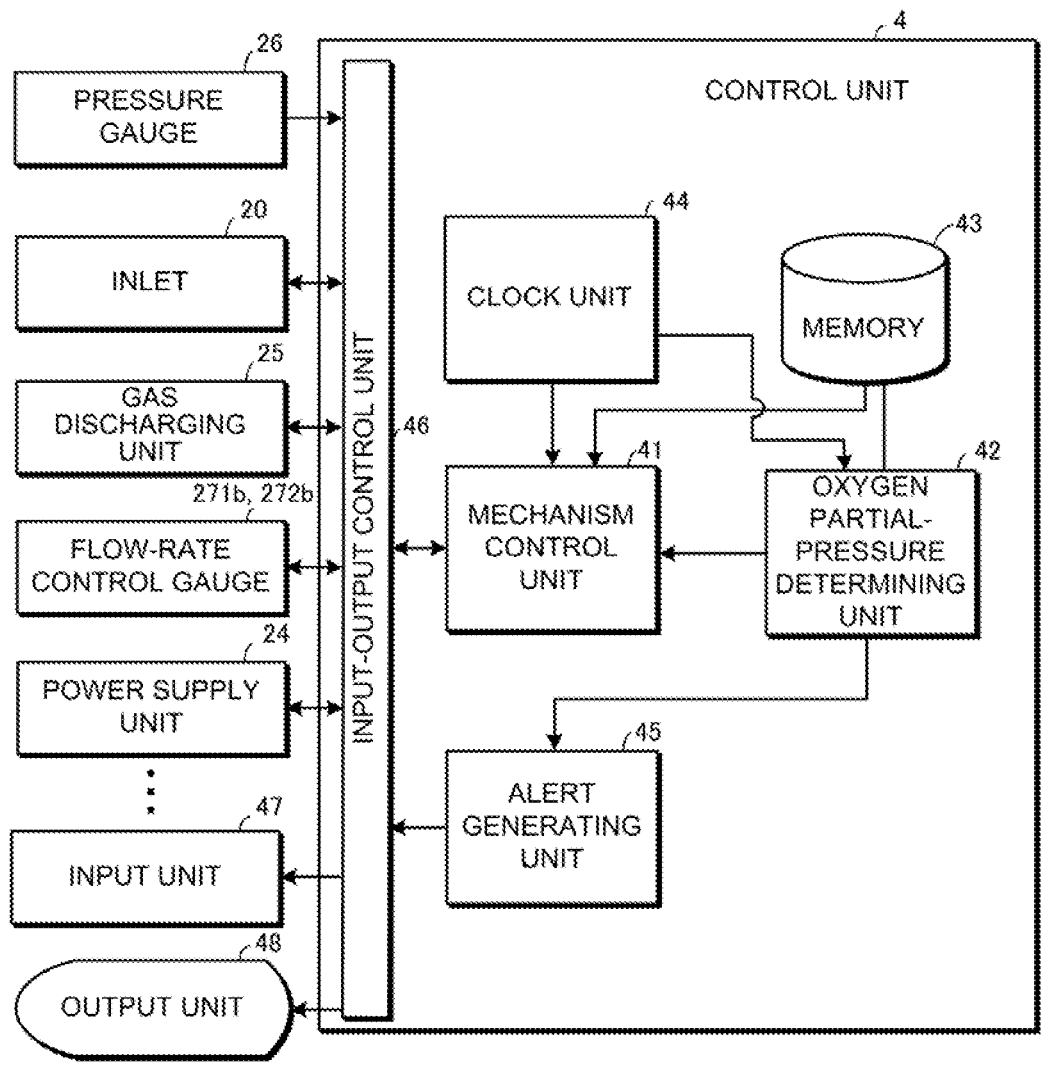
FIG. 2 is a block diagram illustrating a functional structure of a control unit for the film formation apparatus.

The structure of such control unit 4 will be explained with reference to FIG. 2 that is a virtual functional block diagram. That is, the control unit 4 includes a mechanism control unit 41, an oxygen partial-pressure determining unit 42, a memory 43, a clock unit 44, an alert generating unit 45, and an input-output control unit 46.

The mechanism control unit 41 is a process unit that controls the mechanism of each component of the film formation apparatus 1. Example controls are a control on the opening and closing of the load-lock chamber, a control on the internal pressure thereof, a control on the opening and closing of the inlet 20, a control on the discharging speed of the gas discharging unit 25, a control on the timing of an introduction of the sputter gas by the sputter gas introducing unit 27, a control on the introducing amount of the sputter gas by the sputter gas introducing unit 27, a control on the voltage applying timing for the power supply unit 24, and a control on the supplied power amount for the power supply unit 24.

The oxygen partial-pressure determining unit 42 obtains a base pressure measured by the pressure gauge 26 that measures the pressure inside the chamber 2. The oxygen partial-pressure determining unit 42 refers data on the optimized oxygen partial pressure stored in the memory 43, and determines the optimized oxygen partial pressure that corresponds to the obtained base pressure. The base pressure is a pressure inside the chamber 2 before the introduction of the sputter gas, and more specifically, is a pressure after the workpiece W is carried into the chamber 2, the inlet 20 is closed, and the gas discharging unit 25 discharges the gas in the chamber 2 for a preset time period. This preset time period will be referred to as a "discharging time t" below. The optimized oxygen partial pressure is the optimized value of the oxygen partial pressure in the sputter gas.

The mechanical control unit 41 generates a control signal to achieve the oxygen partial pressure in the sputter gas to be the optimized oxygen partial pressure determined by the oxygen partial-pressure determining unit 42, and transmits the control signal to the flow-rate control gauge 272b of the oxygen introducing unit 272a. The flow-rate control gauge 272b of the oxygen introducing unit 272a adjusts the flow rate of the oxygen in accordance with the received control signal, thereby controlling the oxygen partial pressure in the sputter gas to be the optimized oxygen partial pressure. Note that in this embodiment, since the argon gas partial pressure is a fixed value, the flow-rate control gauge 271b for the argon gas adjusts the flow rate based on the preset argon gas partial pressure.

The memory 43 stores various information necessary for the control according to this embodiment, and as explained above, the data of the optimized oxygen partial pressure is stored in this embodiment. The data of the optimized oxygen partial pressure is can be obtained by carrying out tests, etc., beforehand, and has a tendency of decreasing the optimized oxygen partial pressure as the base pressure increases. In this case, the reason why the optimized oxygen partial pressure decreases as the value of the base pressure increases will be explained in detail.

Figure 3:
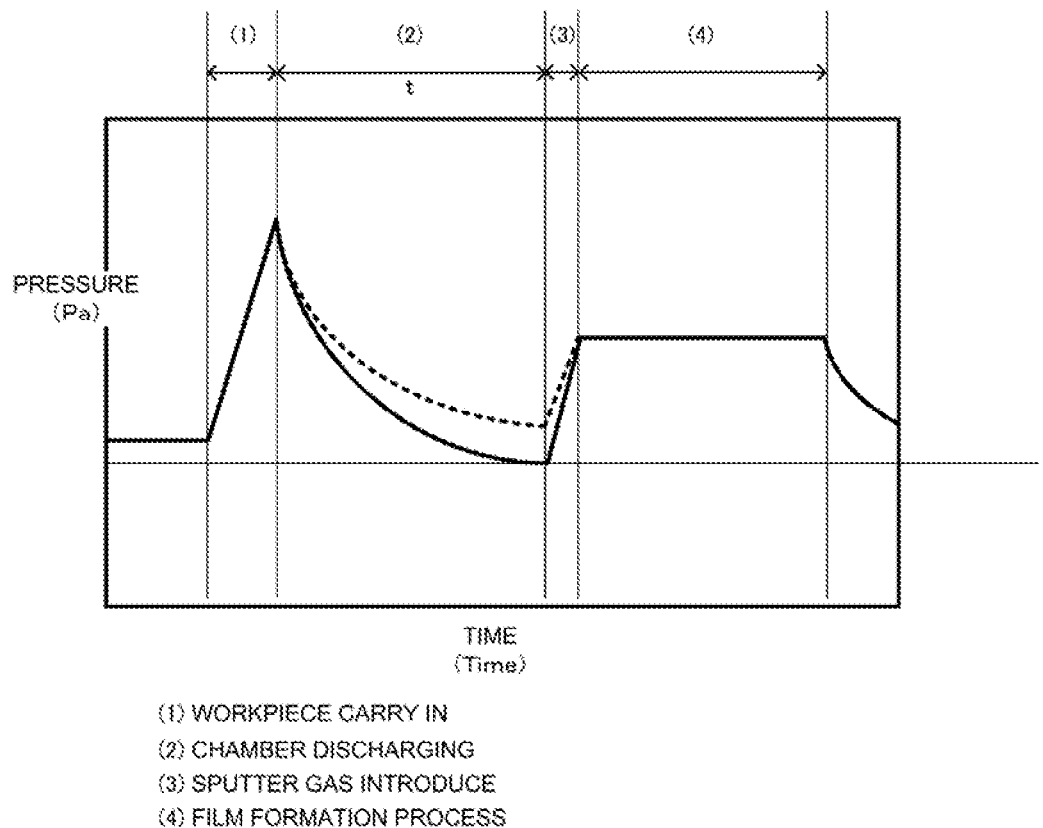
FIG. 3 is a graph indicating a change in chamber internal pressure at the initial and latter stages of a film formation process.

FIG. 3 illustrates a change in pressure inside the chamber 2 in the film formation process. The film formation process is repeatedly executed while the workpieces W are being replaced. In the graph, a change in pressure at the initial stage at which no ITO film is sticking to the internal wall of the chamber 2 after the start of film formation is indicated by a continuous line, while a change in pressure at the latter stage at which the ITO film is sticking to the internal wall of the chamber 2 upon repeating the film formation is indicated by a dashed line.

In both the initial stage and the latter stage, the pressure shows a similar overall transition. When the workpiece W is carried into the chamber 2, since the inlet 20 is opened with the pressure in the load-lock chamber being higher than that of the chamber 2, the pressure increases (see (1) in the figure). After the inlet 20 is closed, the gas in the chamber 2 is discharged for the predetermined discharging time t, and the chamber 2 is depressurized to the base pressure (see (2) in the figure). Subsequently, by introducing the sputter gas, the pressure increases (see (3) in the figure). During the film formation process, the discharging and the sputter gas supply are performed to maintain the constant amount of sputter gas (see (4) in the figure). After the completion of the film formation, since the introduction of the sputter gas stops, the pressure decreases.

Even when, however, the discharging is performed for the same discharging time t after the workpiece W is carried into, the latter stage has a higher base pressure than that of the initial stage. This is considered to be caused by the ITO film, which is sticking to the internal wall of the chamber 2 by film formation, absorbing the external air and the gas like vapor in air entered when the workpiece W is carried. The absorbed gas is released to the interior of the chamber 2 as the outgas when the chamber 2 is depressurized to the base pressure. When the film formation is repeated, the amount of sticking ITO film increases, and thus the amount of outgas increases. Accordingly, when discharging is performed for the same discharging time t, the base pressure increases by the amount corresponding to the released outgas.

Since the outgas contains oxygen, when the constant oxygen partial pressure in the sputter gas is maintained, the total of the oxygen in the sputter gas and the oxygen in the outgas gradually increases. Consequently, the amount of plasma oxygen at the time of film formation increases.

Figure 4:
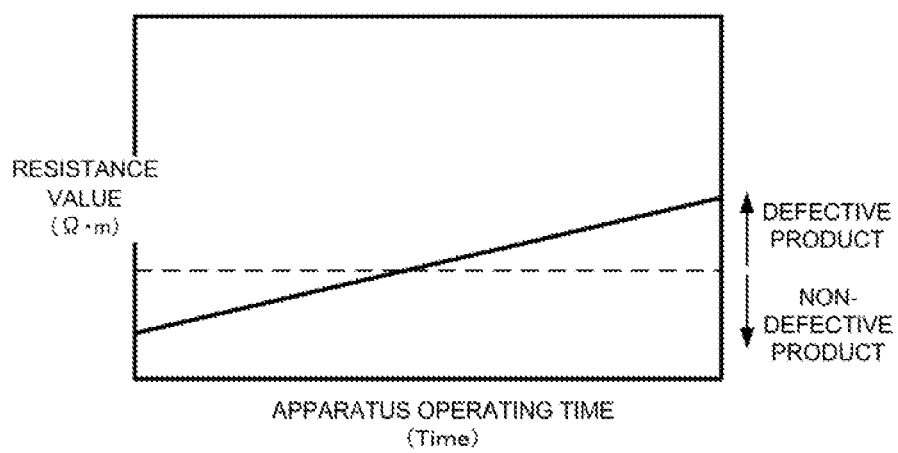
FIG. 4 is a graph illustrating an exemplary relationship between a film formation process time and a resistance value.

When the oxygen in the film formation process exceeds the appropriate amount, the resistance value of a product will increase. FIG. 4 is a graph illustrating an exemplary change in resistance value of the ITO film when the film formation apparatus 1 is kept operating with the constant oxygen partial pressure in the sputter gas being maintained. As illustrated in FIG. 4, when the film formation apparatus 1 is kept operating with the constant oxygen partial pressure, the resistance value of the ITO film proportionally increases. When the resistance value becomes equal to or greater than a certain value, a determination as a defective product may be made.

When, however, the oxygen partial pressure in the sputter gas is decreased in accordance with the increase amount of the oxygen in the outgas, the appropriate amount of oxygen in the film formation process is maintainable, and an increase in resistance value is avoidable. Although a measurement of the increase amount of oxygen in the outgas is difficult, as explained above, the base pressure increases in accordance with the increase in amount of outgas. That is, by decreasing the oxygen partial pressure in the sputter gas in accordance with the increase in base pressure that is measurable by the pressure gauge 26, the appropriate amount of the oxygen is maintainable in the film formation process. In view of such aspect, a test, etc., is carried out beforehand, and the data on the optimized oxygen partial pressure in accordance with the base pressure is created and stored in the memory 43.

In addition, the memory 43 may also store the upper limit value of the base pressure. When the base pressure keeps increasing, that is, when the amount of outgas keeps increasing, the oxygen in the outgas alone may exceed the necessary oxygen amount for the film formation process. In addition, when the pressure in the chamber 2 becomes too high, this affects the density of the ITO film and the uniformity thereof.

Consequently, even if the oxygen partial pressure in the sputter gas is decreased, an increase in resistance value of the ITO film is unavoidable in such case. In this case, it is necessary to clean up the interior of the chamber 2 to eliminate the sticking ITO film to the internal wall of the chamber 2. The upper limit value may be determined by carrying out tests, etc., beforehand, but may be set to, for example, $6 \times 10^{-3}$ [Pa].

The clock unit 44 is a timer that counts a time. The mechanism control unit 41 controls, based on the counted time by the clock unit 44, the timing for carrying in and carrying out the workpiece W, a timing for introducing and stopping the introduction of the sputter gas, a timing for voltage application, and the like. In addition, the oxygen partial-pressure determining unit 42 obtains the measurement value of the base pressure from the pressure gauge 26 after the elapse of the predetermined discharging time t that is counted time by the clock unit 44 since the workpiece W is carried into and the inlet 20 is closed.

The alert generating unit 45 generates an alert when the base pressure obtained from the pressure gauge 26 exceeds the upper limit value stored in the memory 43. The alert may inform an operator the value of the base pressure and the necessity of cleaning the interior of the chamber 2.

The input-output control unit 46 is an interface that controls signal conversion and signal input or output between the components to be controlled.

In addition, the control unit 4 is connected to an input unit 47 and an output unit 48. The input unit 47 is an inputter, such as a switch, a touch panel, a keyboard, or a mouse, that enables the operator to operate the film formation apparatus 1. As for the data of the optimized oxygen partial pressure above, a desired value may be input via the input unit 47.

The output unit 48 is an outputter, such as a display, a lamp, or a meter, that enables the operator to visually check information of the status of the apparatus. For example, the output unit 48 outputs the alert generated by the alert generating unit 45.

[Action]

Next, an explanation will be given of an action of the film formation apparatus 1 and a film formation method according to this embodiment. The action of the film formation apparatus 1 to be explained later is controlled by the mechanism control unit 41 of the control unit 4. The workpiece W is carried into the load-lock chamber from the exterior that has an ambient pressure. After the load-lock chamber is depressurized beforehand to the preset pressure, the inlet 20 is opened, and the workpiece W is carried into the chamber 2. Since the pressure in the load-lock chamber is higher than that of the chamber 2, when the inlet 20 is opened, the pressure in the chamber 2 temporarily increases. The carried workpiece W is then placed on the stage 21. The workpiece W is carried by an unillustrated carrying unit. After the workpiece W is placed on the stage 21, the inlet 20 is closed to gas-tightly seal the interior of the chamber 2. Since the gas in the chamber 2 is always discharged by the gas discharging unit 25, by closing the inlet 20, the chamber 2 is depressurized.

The oxygen partial-pressure determining unit 42 of the control unit 4 obtains the base pressure value from the pressure gauge 26 after the elapse of the predetermined discharging time t that is counted time by the clock unit 44 since the inlet 20 is closed.

The oxygen partial-pressure determining unit 42 refers the data of the optimized oxygen partial pressure from the memory 43, and determines the value of the optimized oxygen partial pressure that corresponds to the base pressure obtained from the pressure gauge 26. The mechanism control unit 41 generates the control signal based on the determined optimized oxygen partial pressure by the oxygen partial-pressure determining unit 42, and transmits the control signal to the flow-rate control unit 272*b* of the oxygen introducing unit 272*a*. The flow-rate control gauge 272*b* adjusts the flow rate to achieve the optimized oxygen partial pressure in the sputter gas.

The sputter gas is introduced to the chamber 2 from the sputter gas introducing unit 27, and the power supply unit 24 applies a DC voltage to the target 231. When the plasma of the sputter gas is obtained upon application of the DC voltage, ions are produced. When the produced ions collide with the target 231, the particles of the film formation material of the target 231 are beaten out. When the beaten particles are deposited on the workpiece W placed on the stage 21, a thin film is formed on the workpiece W.

After the completion of the film formation process, the introduction of the sputter gas is stopped, the inlet 20 is opened, the workpiece W having undergone the film formation is taken out from the interior of the chamber 2, and the next workpiece W is carried therein. As for the subsequent workpiece W, the film formation process is also performed in sequence through the same scheme as that of the first workpiece W. When, however, the film formation process is repeatedly executed, the ITO film sticks to the internal wall of the chamber 2, and the outgas is produced. Hence, the measured value of the base pressure by the pressure gauge 26 gradually increases. The oxygen partial-pressure determining unit 42 refers the data of the optimized oxygen partial pressure from the memory 43, and determines the optimized oxygen partial pressure that corresponds to the increased base pressure. Accordingly, the oxygen partial pressure in the sputter gas gradually decreases, and thus the appropriate oxygen amount in the film formation process is maintained. Hence, even if the film formation process is repeatedly executed, a film formation maintaining the film quality is executable until the base pressure exceeds the upper limit value.

When the value of the measured base pressure by the pressure gauge 26 exceeds the upper limit value, the alert generating unit 45 generates an alert, and outputs this alert to the output unit 48. At the time at which the alert is output, the film formation process may be suspended, or the film formation process may be continuously executed together with an output of the alert.

EXAMPLE

Figure 5:
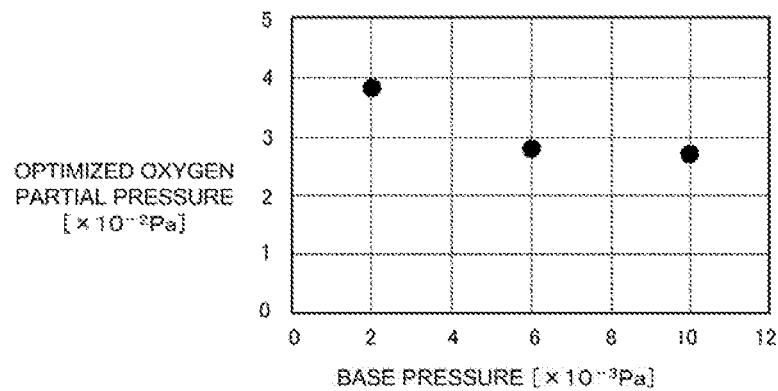
FIG. 5 is a graph illustrating an oxygen partial pressure in accordance with a base pressure in an example.

As for the film formation apparatus 1 in the above embodiment, the film formation process was carried out under the following condition:

DC power: 3.5 [kW];
Ar gas pressure: 1.46 [Pa] (420 sccm);
$O_2$ gas pressure: 0.037 [Pa] (12.5 sccm);
Film formation pressure (Ar+$O_2$): 1.50 [Pa];
Discharge voltage: 398 [V];
Gas discharging time: 23.4 [s];
Film formation time: 5.2 [s];
Film formation speed: 7.7 [nm/s];
Target 231: Indium Tin Oxide (ITO);
Film thickness: 40 [nm]; and
Workpiece W: Polycarbonate substrate Under the above condition, the film formation process was continuously executed on the multiple workpieces W, respectively. In each film formation process, at a time at which the workpiece W was carried into the chamber 2 and the discharging time elapsed, the base pressure was measured. The initial base pressure was $2 \times 10^{-3}$ [Pa], and when the film formation process was repeatedly executed, the base pressure increased. As illustrated in the graph in FIG. 5, the oxygen partial pressure was decreased in accordance with the increase in base pressure.

Figure 6:
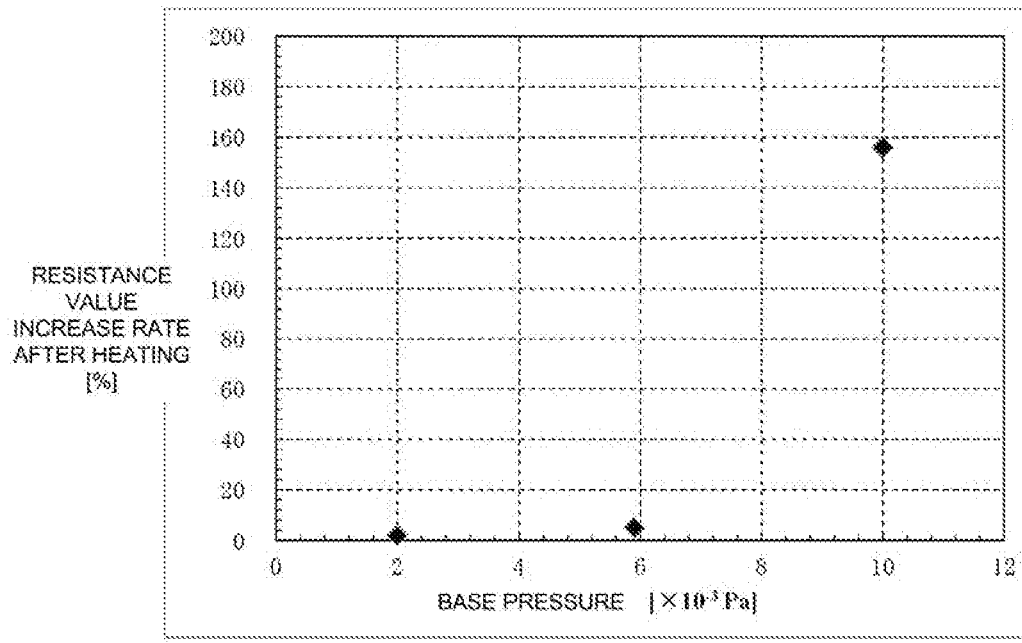
FIG. 6 is a graph illustrating a relationship between a base pressure and a resistance increase rate in an example.

As for the workpieces W having undergone the film formation at the base pressures of $2 \times 10^{-3}$ [Pa], $6 \times 10^{-3}$ [Pa], and $10 \times 10^{-3}$ [Pa], respectively, a heating test for 92 hours was carried out at the temperature of 80° C., and the resistance value after the heating test was measured. The graph in FIG. 6 shows the heating test results. The ITO film formed at the base pressure of $6 \times 10^{-3}$ [Pa] had a lower resistance increase rate than that of the initial base pressure which was $2 \times 10^{-3}$ [Pa]. That is, it becomes clear that the appropriate oxygen amount in the film formation process was maintained by decreasing the oxygen partial pressure in the sputter gas. On the other hand, in the case of the base pressure that as $10 \times 10^{-3}$ [Pa], although the oxygen partial pressure was decreased, the resistance increase rate was higher than that of the initial base pressure which was $2 \times 10^{-3}$ [Pa]. This may be caused by the oxygen contained in the outgas exceeding the adjustable amount by the decrease in oxygen partial pressure in the sputter gas, or the increasing pressure in the chamber 2, affecting the density of the film and the uniformity thereof.

[Effect]

(1) The film formation apparatus 1 according to this embodiment includes the chamber 2 that is a sealed container in which the target 231 formed of the film formation material is placed, and into which the workpiece W is carried, the gas discharging unit 25 that discharges the gas in the chamber 2 for the predetermined discharging time to set the interior of the chamber 2 to be in the base pressure after the workpiece W is carried therein, and the sputter gas introducing unit 27 that introduces the sputter gas containing oxygen to the interior of the chamber 2, which is discharged to the base pressure. The sputter gas introducing unit 27 decreases the oxygen partial pressure in the sputter gas to be introduced in the chamber 2 in accordance with the increase in base pressure due to the increasing film formation material sticking to the internal wall of the chamber 2.

With reference to the base pressure that is increased upon production of the outgas, by adjusting the introduced oxygen partial pressure in the sputter gas, the film formation is enabled while maintaining the appropriate oxygen amount in the chamber 2. Hence, provided are the highly-reliable film formation apparatus 1 and film formation method capable of forming a film with an excellent quality and with little variability in quality.

The film formation apparatus 1 includes the pressure gauge 26 that measures the base pressure, and the control unit 4 that determines the oxygen partial pressure in the sputter gas to be introduced by the sputter gas introducing unit 27 in accordance with the base pressure measured by the pressure gauge 26. Since the pressure gauge 26 is normally installed in order to manage the pressure in the chamber 2, the base pressure is easily obtainable from the pressure gauge 26. This enables an oxygen partial pressure control without needing a highly precise gauge, etc., thus advantageous in view of economy.

[Second Embodiment]

An explanation will be given of a second embodiment of the present disclosure with reference to the figures. Note that the same component as that of the first embodiment will be denoted by the same reference numeral, and the detailed explanation thereof will be omitted.

Figure 7:
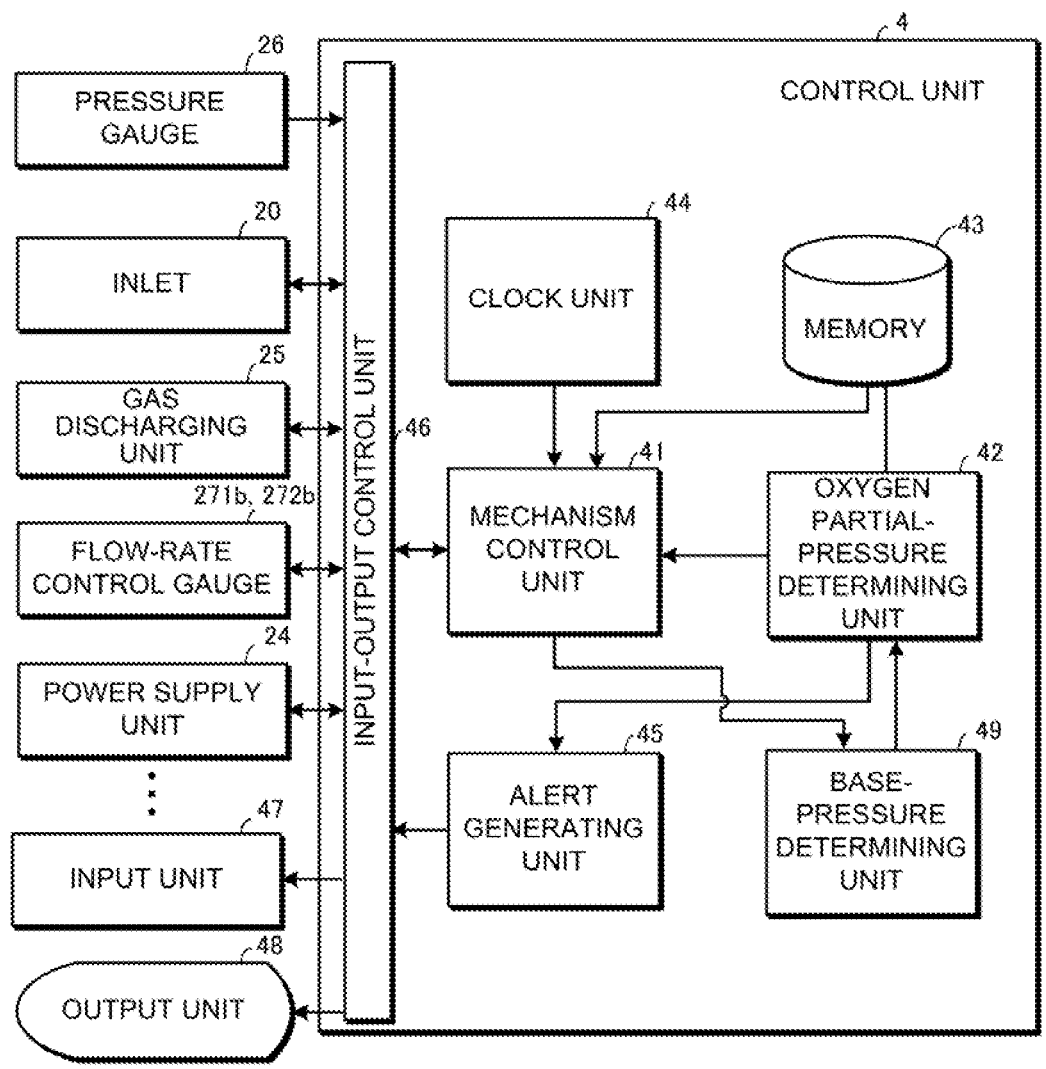
FIG. 7 is a block diagram illustrating a functional structure of a control unit for a film formation apparatus according to a second embodiment of the present disclosure.

A film formation apparatus 1 according to the second embodiment employs the same entire structure as that of the first embodiment. FIG. 7 illustrates the functional structure of the control unit 4 for the film formation apparatus 1 in the second embodiment. In addition to the same structure as that of the first embodiment, the control unit 4 includes a base-pressure determining unit 49. In the first embodiment, the mechanical control unit 41 obtains the value of the measured base pressure by the pressure gauge 26, whereas in the second embodiment, the base pressure is determined based on the accumulated power amount supplied from the power supply unit 24 to the target 231.

Figure 8:
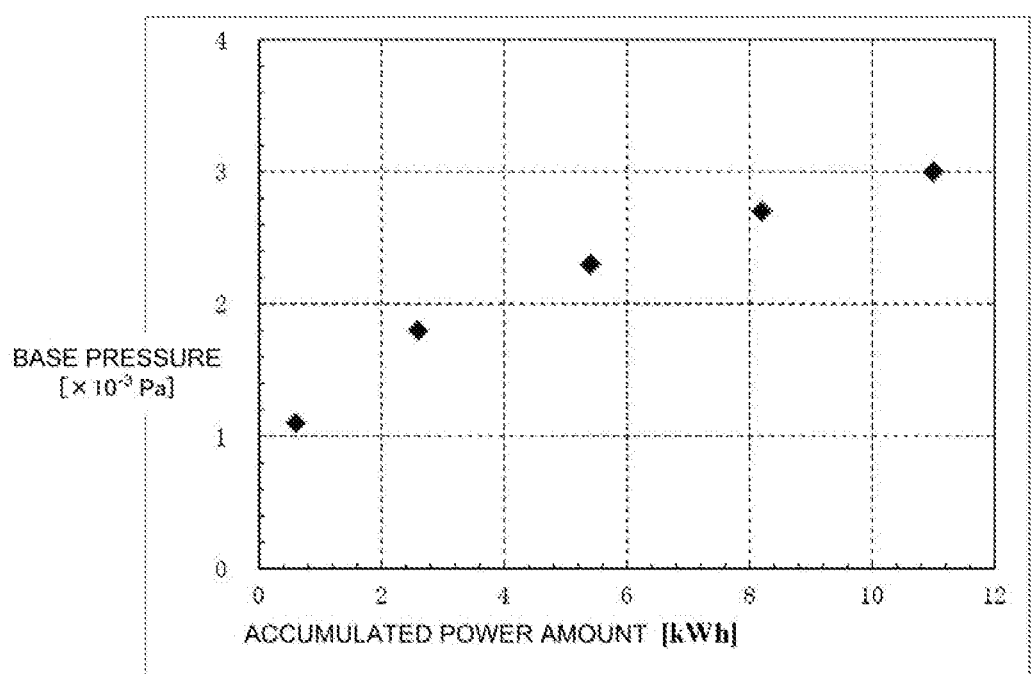
FIG. 8 is a graph illustrating a relationship between an accumulated power amount and a base pressure.

The accumulated power amount is an accumulated amount of power that has been supplied from the power supply unit 24 to the target 231 in each film formation process when the workpiece W is replaced and the film formation process is repeatedly executed. As illustrated in FIG. 8, the accumulated power amount increases every time the film formation process is repeated. As already explained in the first embodiment, the base pressure also increases every time the film formation process is repeated. That is, in accordance with the increase in accumulated power amount, the base pressure increases. Hence, a test, etc., is carried out beforehand to create the data of the base pressure that corresponds to the accumulated power amount, and this data is stored in the memory 43.

As explained above, the mechanism control unit 41 controls the timing for applying the voltage by the power supply unit 24 and the supplied power amount therefrom. The base-pressure determining unit 49 obtains the supplied power amount from the mechanism control unit 41, and calculates the accumulated power amount. Next, the data of the base pressure stored in the memory 43 is referred, and the base pressure that corresponds to the calculated accumulated power amount is determined.

The oxygen partial-pressure determining unit 42 refers the data of the optimized oxygen partial pressure stored in the memory 43, and determines the optimized oxygen partial pressure that corresponds to the determined base pressure by the base-pressure determining unit 49. The mechanism control unit 41 generates the control signal to achieve the optimized oxygen partial pressure in the sputter gas determined by the oxygen partial-pressure determining unit 42, and transmits the control signal to the flow-rate control gauge 272b of the oxygen introducing unit 272a. The flow-rate control gauge 272b of the oxygen introducing unit 272a adjusts the flow rate of the oxygen to be introduced in the chamber 2 in accordance with the received control signal.

As explained above, according to the second embodiment, the control unit 4 determines, based on the determined base pressure in accordance with the accumulated power amount supplied from the power supply unit 24 to the target 231, the oxygen partial pressure in the sputter gas at the sputter gas introducing unit 27. Even if the base pressure is not measurable due to the internal environment of the chamber 2, the film formation situation, etc., the base pressure is still determinable based on the accumulated power amount. Hence, the oxygen partial pressure in the sputter gas is adjustable, and thus a film formation while maintaining the appropriate oxygen amount is enabled like the first embodiment.

[OTHER EMBODIMENTS]

The present disclosure is not limited to the above embodiments. For example, the above film formation apparatus 1 may be applied to a multi-chamber type plasma processing apparatus that includes the multiple chambers for the film formation process like sputtering and for the film treatment process like etching.

In addition, in the above embodiment, the explanation has been given of an example case in which the inlet 20 is connected to the load-lock chamber, but the present disclosure is not limited to this structure. For example, the workpiece W may be directly carried in the inlet 20 from the exterior. When the load-lock chamber is not applied, external air that enters at the time of carrying in the workpiece W increases, and thus the amount of outgas from the sticking ITO film to the internal wall of the chamber 2 may consequently increase. Hence, for example, the discharging time t may be increased so as to well discharge the entering external air. In addition, when the load-lock chamber is not applied, and when the inlet 20 is opened, the interior of the chamber 2 increases up to the ambient pressure. Hence, when the inlet 20 is being opened, the gas discharging unit 25 may be deactivated, and after the inlet is closed, the gas discharging unit 25 may be activated again to start discharging the gas.

Although the embodiments of the present disclosure and modified examples of respective components have been explained above, those embodiments and modified examples of respective components are merely presented as examples, and are not intended to limit the scope of the present disclosure. Those novel embodiments can be carried out in other various forms, and various omissions, replacements, and modifications can be made thereto without departing from the scope of the present disclosure. Such embodiments and modified forms thereof are within the scope of the present disclosure, and also within the scope of the subject matter as recited in appended claims.

What is claimed is:

1. A film formation method of forming a film on a workpiece by plasma, the method comprising:
   carrying the workpiece into an interior of a sealed container in which a target formed of a film formation material is placed;
   discharging a gas in the sealed container for a predetermined time period after the workpiece is carried in to obtain a base pressure;
   introducing a sputter gas containing oxygen to the interior of the sealed container having undergone the discharging and becoming the base pressure; and
   decreasing an oxygen partial pressure in the sputter gas to be introduced in the sealed container in accordance with an increase in the base pressure due to an increase of the film formation material sticking to the interior of the sealed container.

2. A film formation apparatus for forming a film on a workpiece by way of a plasma discharge, the apparatus comprising:
   a sealed container including a target formed of a film formation material disposed therein, said sealed container being configured to receive the workpiece onto which a film is to be formed utilizing material obtained from said target;
   a control unit programmed to control operation of said film formation apparatus;
   a gas discharging unit operably coupled to said control unit, said control unit being programmed to discharge a gas in the sealed container via said gas discharging unit for a predetermined time period after the workpiece is carried into the sealed container in order to establish a base pressure; and
   a sputter gas introducing unit operably coupled to said control unit, said control unit being further programmed to introduce a sputter gas containing oxygen to an interior of the sealed container via said sputter gas introducing unit after the base pressure has been established, wherein the control unit adjusts the amount of oxygen delivered in the sputter gas in response to the base pressure of the film formation apparatus.

3. The film formation apparatus of claim 2, wherein the amount of oxygen to be delivered in the sputter gas is determined by the control unit by referencing data in memory to determine an optimized oxygen partial pressure based on the base pressure.

4. The film formation apparatus of claim 2, wherein the control unit is programmed to generate an alert when the base pressure exceeds $6 \times 10^{-3}$ [Pa].

5. The film formation apparatus of claim 2, further comprising a power supply unit operably coupled to said control unit, said control unit being programmed to adjust the amount of oxygen delivered in the sputter gas in response to the base pressure determined based on an accumulated amount of power delivered by the power supply unit to the target over time.

* * * * *